United States Patent
McKee et al.

[11] Patent Number: 5,368,880
[45] Date of Patent: Nov. 29, 1994

[54] EUTECTIC BOND AND METHOD OF GOLD/TITANIUM EUTECTIC BONDING OF CADMIUM TELLURIDE TO SAPPHIRE

[75] Inventors: Richard C. McKee, Glenwood; Sandra L. Baumler, Crownsville, both of Md.; Thomas R. Schimert, Grand Prarie, Tex.

[73] Assignee: Westinghouse Electric Corporation, Pittsburgh, Pa.

[21] Appl. No.: 446,760

[22] Filed: Dec. 6, 1989

[51] Int. Cl.[5] .......................... B05D 5/12; C23C 16/00
[52] U.S. Cl. .................................. 427/125; 427/126.5; 427/250; 148/33.3; 29/897
[58] Field of Search ..................... 427/248.1, 249, 250, 427/125, 126.5, 250; 148/11.5 Q, 33.3; 29/847, 854; 428/408

[56] References Cited

U.S. PATENT DOCUMENTS

| | | | |
|---|---|---|---|
| 3,495,322 | 2/1970 | Goldstein | 29/473.1 |
| 3,711,325 | 1/1973 | Hentzschel | 117/212 |
| 3,992,774 | 11/1976 | Burrer et al. | 29/854 |
| 4,078,711 | 3/1978 | Bell | 228/123 |
| 4,089,991 | 5/1978 | Robillard | 29/628 X |
| 4,104,789 | 8/1978 | Robillard | 29/847 X |
| 4,181,299 | 1/1980 | Peterson et al. | 228/121 |
| 4,574,470 | 3/1986 | Burt | 29/590 |
| 4,576,851 | 3/1986 | Iwamatsu | 428/156 |
| 4,655,848 | 4/1987 | Kay et al. | 148/1.5 |
| 4,743,310 | 5/1968 | Kay et al. | 148/33 |
| 4,771,018 | 9/1988 | Bhattacharyya et al. | 148/DIG. 62 X |
| 4,963,509 | 10/1990 | Yoshizawa et al. | 148/DIG. 62 X |

Primary Examiner—Peter A. Nelson

[57] ABSTRACT

A method of forming a eutectic bond, of Cadmium Telluride to Sapphire utilizing the Gold/Silicon eutectic bonding of the Cadmium Telluride to the Sapphire. A multi-layer structure of: Chromium which provides adhesion to the Cadmium Telluride; a Titanium layer which functions as a diffusion barrier to the Gold, and a Gold layer are sequentially evaporated on the Cadmium Telluride; a separate multilayered structure of: Silicon grown on Sapphire, and Gold evaporated upon the Silicon. These two multilayered structures are then eutectically bonded. This method enables the expansion coefficient of the eutectic layer to be tailored through the Gold concentration to match that of the Cadmium Telluride. This method also allows the bonding stress to be confined between the Gold/Silicon eutectic and the Sapphire substrate, eliminating the bonding stress in the Cadmium Telluride. Also, due to the precision of the thickness of the evaporated layers, the bonded substrates are inherently planar and parallel.

3 Claims, 1 Drawing Sheet

EUTECTIC BOND AND METHOD OF GOLD/TITANIUM EUTECTIC BONDING OF CADMIUM TELLURIDE TO SAPPHIRE

BACKGROUND OF THE INVENTION

The present invention relates to a eutectic bond and a method of Gold/Silicon eutectic bonding of Cadmium Telluride to a Sapphire wafer. And, more particularly to eutectic bonding which achieves precise parallelism and tailors thermal expansion coefficients through the control of Gold and Silicon layer thickness.

Gold/Silicon (Au/Si) bonding is widely used in the semiconductor industry to attach Silicon die to Gold-plated packages. In those applications the parallelism of the Silicon die to the package is not a critical requirement. For that reason neither the amount of the Silicon nor the amount of the Gold used in the bonding process is controlled.

Typically, only a minimum amount of Gold is required to form the eutectic layer between the Silicon die and the package.

SUMMARY OF THE INVENTION

The preferred embodiment of the present invention is a eutectic bond formed between a Cadmium Telluride substrate having predetermined layers of Chromium, Titanium, Au—Si eutectic, all bonded to Sapphire. The function of these layers is as follows: Chromium, a highly infrared reflective, non-diffusive material; Titanium, an Au diffusion barrier; Au—Si eutectic, a strong, uniformly planar, precisely parallel, thermally compatible layer formed using precise thicknesses of Au and Si; and, Sapphire, the mechanical support substrate for the entire assembly.

The further preferred embodiment of the present invention is a method of forming a eutectic bond. This bond is formed by first polishing a Cadmium Telluride substrate, then a layer of Chromium is evaporated upon this Cadmium Telluride substrate. This layer of Chromium has a depth of not less than 500 Angstroms. Upon this first layer of Chromium a layer of Titanium of not less than 1500 Angstroms is evaporated. This layer of Titanium serves as a substrate for the third layer of Gold, wherein this layer has a depth of approximately 1000 Angstroms.

A first layer of Silicon is grown upon a Sapphire wafer, wherein this first layer of Silicon has a depth of not less than 500 Angstroms. After the growth of a first layer of Silicon upon the Sapphire wafer native Silicon Dioxide (SiO$_2$) is removed from the first layer of Silicon by a cleaning process. Then a second layer of Gold is evaporated upon this cleaned first layer of Silicon. This second layer of Gold has a depth of not less than 5000 Angstroms.

The Cadmium Telluride substrate and the Silicon on Sapphire wafer are placed together with the Gold layer in contact. This assembly is then placed upon a heat column which provides a temperature of not less than 390 degrees Centigrade. The Cadmium Telluride substrate is scrubbed onto said Silicon on Sapphire wafer for a period of time of not less than fifteen seconds. The Cadmium Telluride substrate and the Silicon on Sapphire wafer are removed from the heat column. The eutectic bonding has occurred between the two individual pieces.

Once the CdTe and the Sapphire have been bonded, the Sapphire provides mechanical support for the required device thinning of the CdTe. This bonding allows planar, epi-ready thinning of CdTe substrate to sub-micron thicknesses.

BRIEF DESCRIPTION OF THE DRAWINGS

For a better understanding of the invention reference may be had to the preferred embodiment exemplary of the invention, shown in the accompanying drawings, in which.

DESCRIPTION OF THE PREFERRED EMBODIMENTS

Figure 1A:
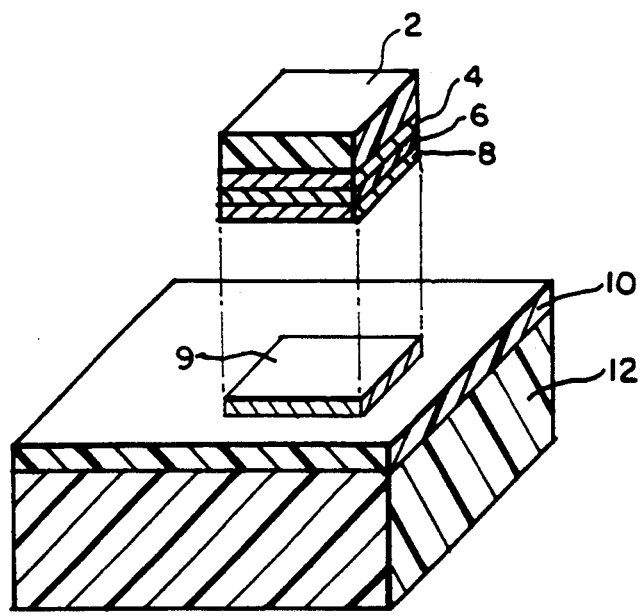
FIG. 1A is an isometric side view of the pre-bonding configuration of the Cadmium Telluride to Sapphire employing the Gold/Silicon eutectic bonding of the Cadmium Telluride to the Silicon film grown on the Sapphire.

FIG. 1A is an isometric side view of the pre-bonding configuration of the Cadmium Telluride to Sapphire employing the Gold/Silicon eutectic bonding of the Cadmium Telluride to Silicon.

As shown in FIG. 1A, Cadmium Telluride substrate 2 is cut and polished to the desired specifications. A first layer of Chromium 4, or any highly longwave infrared reflective material, is evaporated to a thickness of at least 500 Angstroms upon the Cadmium Telluride substrate. A layer of chromium 4 in excess of 1500 Angstroms would cause excessive stress in the structure of the cadmium telluride layer. A second layer of a diffusion barrier material, for example Titanium 6, is then evaporated upon the layer of Chromium. The thickness of the Titanium layer 6 is not less than 1500 Angstroms. A maximum thickness of the titanium layer 6 would be 4000 to 5000 Angstroms. Finally, a third layer of Gold 8 is evaporated upon the second layer 6. This third layer of Gold 9 has a depth of at least 1000 Angstroms. The ultimate depth of this gold 9 layer would be governed by the desired amounts of gold in the eutectic bond. FIG. 1A further shows a layer of Silicon 10 grown upon a wafer of single crystal Sapphire 12. This layer of Silicon 10 is grown to a depth of not less than 0.5 microns.

The two individual substrates of: Cadmium Telluride 2, with chromium 4, titanium 6, and gold 8 multilayers, and Silicon 10 on Sapphire 12 are placed one on top of the other with their respective Gold surfaces 8, 9 touching. The combined substrates are then placed on a heat column set at a temperature of at least 390 Centigrade and scrubbed. This "scrubbing" is a term of the bonding art which consists of the rapid rubbing together of two materials with a pressure of several lbs./cm$^2$. Scrubbing initiates the bonding process, and hastens the overall bonding process. After approximately fifteen seconds upon the heat column the bonded substrates are removed and cooled. The Cadmium Telluride substrate 2 can then be thinned and polished to a desired thickness.

Figure 1B:
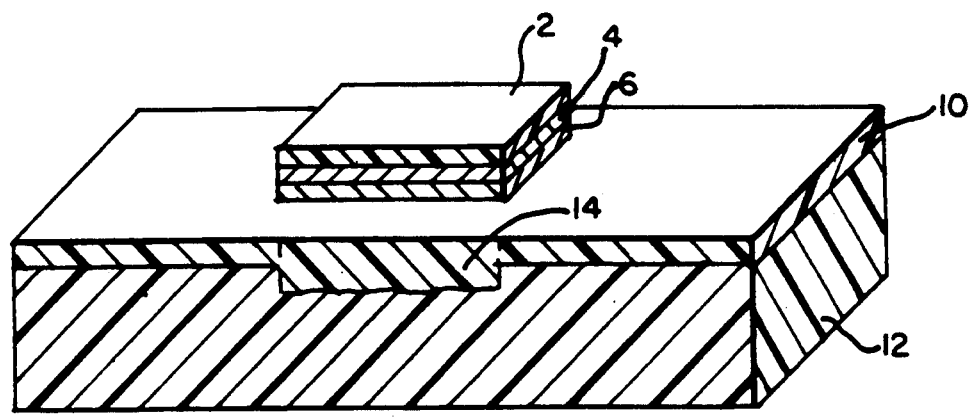
FIG. 1B is an isometric side view of the post-bonding configuration of the Cadmium Telluride to Sapphire employing the Gold/Silicon eutectic bonding of the Cadmium Telluride to the Silicon film grown on the Sapphire.

FIG. 1B is an isometric side view of the post-bonding configuration of the Cadmium Telluride to Sapphire employing the Gold/Silicon eutectic bonding of the Cadmium Telluride to the Sapphire. The Cadmium Telluride substrate 2 with layers of Chromium 4 and Titanium 6 resides upon the Silicon-on-Sapphire 12 substrate. Where the Cadmium Telluride 2 and the Silicon-on-Sapphire 12 touch, a Gold/Silicon eutectic bond 14 is formed. The Gold/Silicon eutectic bond 14 functions as bond and a stress barrier between the Cadmium Telluride and the Sapphire for the temperature range of interest (77K. to 500K.). The Chromium 4 and Titanium 6 layers are so thin that the stress effect which they induce in the Cadmium Telluride substrate 2 is minimal.

As can be seen in Table I, the linear expansion coefficient for the various materials described in the Gold/Silicon eutectic bond 14 requires a close match of the expansion coefficient of Cadmium Telluride to the Sapphire through the use of the Gold/Silicon eutectic bonding. By matching the thermal expansion coefficients the stresses in the Cadmium Telluride substrate 2 induced during temperature excursions is minimal.

TABLE I

| MATERIAL | EXPANSION COEFFICIENTS OF VARIOUS MATERIALS |
|---|---|
| | LINEAR EXPANSION COEFFICIENT |
| Cadmium Telluride (Cd/Te) | $4.5 \times 10^{-6}$ @ 50 C./$5.9 \times 10^{-6}$ @ 0°C. |
| Silicon (Si) | $2.3 \times 10^{-6}$ @ 50° C. |
| Sapphire | $5.8 \times 10^{-6}$ @ 50° C./$7.7 \times 10^{-6}$ 220° C. to 500° C. (EXP. = TO HEAT FLOW) |
| Gold (Au) | $14.2 \times 10^{-6}$ @ 20° C. |
| Chromium (Cr) | $6.0 \times 10^{-6}$ @ 50° C. |
| Titanium (Ti) | $8.4 \times 10^{-6}$ @ 50° C. |

The process for forming the Gold/Silicon eutectic bond requires that the Cadmium Telluride substrate 2 be polished first. Three individual, sequential layers of approximately 500 Angstroms Chromium 4, 1500 Angstroms Titanium 6, and 1000 Angstroms Gold 8 are then evaporated upon the polished Cadmium Telluride substrate 2. On a Sapphire wafer 12, a layer of not less than 0.5 micron of Silicon 10 is grown. Native Silicon Dioxide formed upon the Silicon 10, which occurs on the silicon surface with each exposure to air, is removed using any means including, but not limited to a "rapid dip" method in dilute hydrofluoric acid. After the cleaning of the Silicon, a 5000 Angstrom layer of Gold 9 is evaporated upon the cleaned Silicon layer 10. The Cadmium Telluride substrate 2 with its multiple layers of Chromium 4, Titanium 6 and Gold 8 is placed upon the 5000 Angstrom layer of Gold evaporated upon the Silicon-on-Sapphire wafer 12. The Cadmium Telluride substrate 2 and Silicon-on-Sapphire wafer 12 are "scrubbed" together on a heat column set at approximately 390 degrees centigrade. This scrubbing in the presence of heat initiates the bonding process. After a period of approximately 15 seconds on the heat column, the Cadmium Telluride substrate 2, now bonded to the Silicon-on-Sapphire wafer 12 are removed from the heat column and allowed to cool. After cooling, the Gold/Silicon eutectic bond layer 14 formed between the two substrates facilitates the thinning and polishing of the Cadmium Telluride 2 to the desired thickness.

This Gold/Silicon eutectic bond 14, as shown in FIG. 1B is an integral part of next generation Mercury Cadmium Telluride (HgCdTe) sensors operable in the 8 to 12 micron range which require a significantly thinned Cadmium Telluride substrate with precision parallelism and planarity.

Numerous variations may be made in the above-described combination and different embodiments of this invention may be made without departing from the spirit thereof. Therefore, it is intended that all matter contained in the foregoing description and in the accompanying drawings shall be interpreted as illustrative and not in a limiting-sense.

We claim:
1. A method of forming a eutectic bond, said method comprising the steps of:
 (a) polishing a Cadmium Telluride substrate;
 (b) evaporating upon said Cadmium Telluride substrate a first layer of Chromium, said first layer of Chromium having a depth of not less than 0.5 microns;
 (c) evaporating upon said first layer of Chromium a second Gold diffusion barrier layer, said second layer having a depth of not more than 1500 Angstroms;
 (d) evaporating upon said second layer a third layer of Gold, said third layer of Gold having a depth of approximately 1000 Angstroms;
 (e) growing a first layer of Silicon upon a Sapphire wafer, said first layer of Silicon having a depth of not less than 500 Angstroms;
 (f) removing native Silicon Dioxide from said first layer of Silicon;
 (g) evaporating a second layer of Gold upon said first layer of Silicon, said second layer of Gold having a depth of not less than 5000 Angstroms;
 (h) placing said third layer of Gold upon said Cadmium Telluride substrate proximate and touching said second layer of Gold upon said Sapphire wafer;
 (i) placing said Cadmium Telluride substrate and said Silicon on Sapphire wafer upon a heat column, said heat column having a temperature of not less than 390 degrees centigrade;
 (j) scrubbing said Cadmium Telluride substrate onto said Silicon on Sapphire wafer for a time period of not less than fifteen seconds;
 (k) removing said Cadmium Telluride substrate and said Silicon on Sapphire wafer from said heat column; and,
 (l) thinning and polishing said Cadmium Telluride substrate.

2. A method of bonding cadmium telluride to sapphire comprising the steps of:
 (a) providing a substrate of cadmium telluride having a top and bottom surface;
 (b) polishing the bottom surface of the cadmium telluride substrate;
 (c) depositing a layer of chromium upon the polished bottom surface of the cadmium telluride substrate, said chromium layer having a thickness of at least 500 Angstroms;
 (d) depositing upon the chromium layer a titanium diffusion barrier layer having a thickness of less than 1500 Angstroms;
 (e) depositing upon the titanium layer a layer of gold having a thickness of at least 1000 Angstroms;
 (f) providing a single crystal substrate of sapphire;
 (g) growing an epitaxial layer of silicon upon the sapphire substrate, which silicon layer has a thickness of about 0.5 micrometers;
 (h) depositing upon the silicon layer a layer of gold having a thickness of about 5000 Angstroms;

(i) placing the cadmium telluride substrate upon the sapphire substrate, with the gold layer on the bottom surface of the cadmium telluride contacting the gold layer atop sapphire substrate;

(j) forming a eutectic bond of gold-silicon extending into the sapphire substrate by heating and scrubbing together the contacted substrates.

3. The method set forth in claim 2, wherein the contacted substrates are heating in a heat column at about 390° C. for a period sufficient to form the eutectic bond of gold-silicon.

* * * * *